United States Patent
Sugahara

(10) Patent No.: US 10,096,379 B2
(45) Date of Patent: Oct. 9, 2018

(54) MEMORY DEVICE AND METHOD FOR TESTING RELIABILITY OF MEMORY DEVICE

(71) Applicant: MegaChips Corporation, Osaka-shi (JP)

(72) Inventor: Takahiko Sugahara, Osaka (JP)

(73) Assignee: MegaChips Corporation, Osaka-shi (JP)

( * ) Notice: Subject to any disclaimer, the term of this patent is extended or adjusted under 35 U.S.C. 154(b) by 86 days.

(21) Appl. No.: 14/921,155

(22) Filed: Oct. 23, 2015

(65) Prior Publication Data

US 2016/0118142 A1    Apr. 28, 2016

(30) Foreign Application Priority Data

Oct. 24, 2014 (JP) ................... 2014-217810
Oct. 24, 2014 (JP) ................... 2014-217811

(51) Int. Cl.
| | |
|---|---|
| *G11C 29/00* | (2006.01) |
| *G11C 29/38* | (2006.01) |
| *G11C 29/36* | (2006.01) |
| *G11C 29/18* | (2006.01) |
| *G11C 29/26* | (2006.01) |

(52) U.S. Cl.
CPC ............ *G11C 29/38* (2013.01); *G11C 29/18* (2013.01); *G11C 29/26* (2013.01); *G11C 29/36* (2013.01)

(58) Field of Classification Search
CPC ......... G11C 29/38; G11C 29/26; G11C 29/18; G11C 29/36
See application file for complete search history.

(56) References Cited

U.S. PATENT DOCUMENTS

| | | | |
|---|---|---|---|
| 7,295,674 B2 | 11/2007 | Hars | |
| 7,519,889 B1* | 4/2009 | Cervantes | ...... G01R 31/318385 |
| | | | 714/25 |
| 8,627,158 B2* | 1/2014 | Cadigan | .............. G06F 11/1068 |
| | | | 714/718 |
| 2006/0198515 A1* | 9/2006 | Forehand | ................ G06F 21/80 |
| | | | 380/28 |

(Continued)

FOREIGN PATENT DOCUMENTS

| | | |
|---|---|---|
| JP | 2005-517998 | 6/2005 |
| JP | 2006-147024 A | 6/2006 |

(Continued)

OTHER PUBLICATIONS

Office Action dated May 31, 2018 in Japanese Patent Application No. 2014-217810 (with unedited computer generated English translation), 9 pages.

(Continued)

*Primary Examiner* — Guy Lamarre
(74) *Attorney, Agent, or Firm* — Oblon, McClelland, Maier & Neustadt, L.L.P.

(57) ABSTRACT

A memory controller performs a reliability test only on a memory array out of the memory array and a random number generator on receipt of a memory test command from a testing device while performing a reliability test only on the random number generator out of the memory array and the random number generator on receipt of a random number test command from the testing device.

11 Claims, 7 Drawing Sheets

(56) References Cited

U.S. PATENT DOCUMENTS

| | | | |
|---|---|---|---|
| 2006/0218452 A1* | 9/2006 | Njinda | G11C 29/14 714/718 |
| 2007/0067375 A1 | 3/2007 | Inaoka et al. | |
| 2009/0228751 A1* | 9/2009 | Gloekler | G01R 31/318547 714/728 |
| 2009/0276617 A1* | 11/2009 | Grell | G06F 21/575 713/2 |
| 2010/0218059 A1* | 8/2010 | Gangasani | G01R 31/318385 714/728 |

FOREIGN PATENT DOCUMENTS

| | | | |
|---|---|---|---|
| JP | 2009-98973 A | 5/2009 | |
| JP | 2014-75082 A | 4/2014 | |
| JP | 2014 142801 A | 8/2014 | |
| WO | WO 2005/124537 A1 | 12/2005 | |

OTHER PUBLICATIONS

Office Action issued Aug. 10, 2018 in Japanese Patent Application No. 2014-217811 (with unedited computer generated English translation), 11 pages.

* cited by examiner

MEMORY DEVICE AND METHOD FOR TESTING RELIABILITY OF MEMORY DEVICE

CROSS REFERENCE TO RELATED APPLICATIONS

The present application is based on, and claims priority from Japanese Patent Application Serial Numbers 2014-217810 and 2014-217811, the disclosure of which is hereby incorporated by reference herein in its entirety.

BACKGROUND

Technical Field

The present disclosure relates to memory devices such as a semiconductor memory, and method for testing reliability of memory devices.

Related Art

In general reliability tests on semiconductor memories, a testing device is used to write and read data to and from all regions in a memory array with a known test pattern, and the data written to the memory array by the testing device (expected value) is compared with the data read from memory array by the testing device, so as to check the reliability of the memory array.

In pre-shipment inspection of semiconductor memories, in order to reduce a testing cost, reliability test is generally performed concurrently on multiple semiconductor memories, by connecting multiple semiconductor memories to one testing device and writing and reading data to and from the multiple semiconductor memories with a common test pattern.

With semiconductor memories provided with a pseudo-random number generator for improving security, random number values of pseudo-random numbers are predictable, and thus multiple semiconductor memories can generate an identical pseudo-random number by using a common algorithm. Pre-shipment inspection can therefore be conducted concurrently on multiple semiconductor memories with one testing device, in the same way as on general semiconductor memories.

Random number generators are cryptographic technology employed for a wide variety of uses in many security systems.

Random numbers generated by random number generators are used for, for example, key information in a cryptographic algorithm, or authentication codes for mutual authentication between devices, and are closely related to the security strength of a system and thus highly confidential information.

Random numbers generated by random number generators therefore need to be highly random. At shipment of semiconductor devices provided with a random number generator, a random number test is normally performed to evaluate whether a random number generator generates random numbers that meet a required level.

JP2005-517998A and WO2005/124537A describe a technique to evaluate whether the frequencies of appearance of "0" and "1" in random numbers generated by a random number generator are within an allowable range.

SUMMARY

A memory device according to an aspect of the present disclosure includes a memory array for storing content data, a random number generator configured to generate a true random number, and a memory controller connected to the memory array and the random number generator. The memory controller is configured to perform a reliability test only on the memory array out of the memory array and the random number generator on receipt of a first test command from an external device, and perform a reliability test only on the random number generator out of the memory array and the random number generator on receipt of a second test command from the external device.

A method according to another aspect of the present disclosure is a method for testing reliability of a memory device, the memory device including a memory array for storing content data and a random number generator configured to generate a true random number, the method including performing a reliability test only on the memory array out of the memory array and the random number generator on receipt of a first test command from an external device, and performing a reliability test only on the random number generator out of the memory array and the random number generator on receipt of a second test command from the external device.

These and other objects, features, aspects and advantages of the present disclosure will become more apparent from the following detailed description when taken in conjunction with the accompanying drawings.

DETAILED DESCRIPTION

Figure 1:
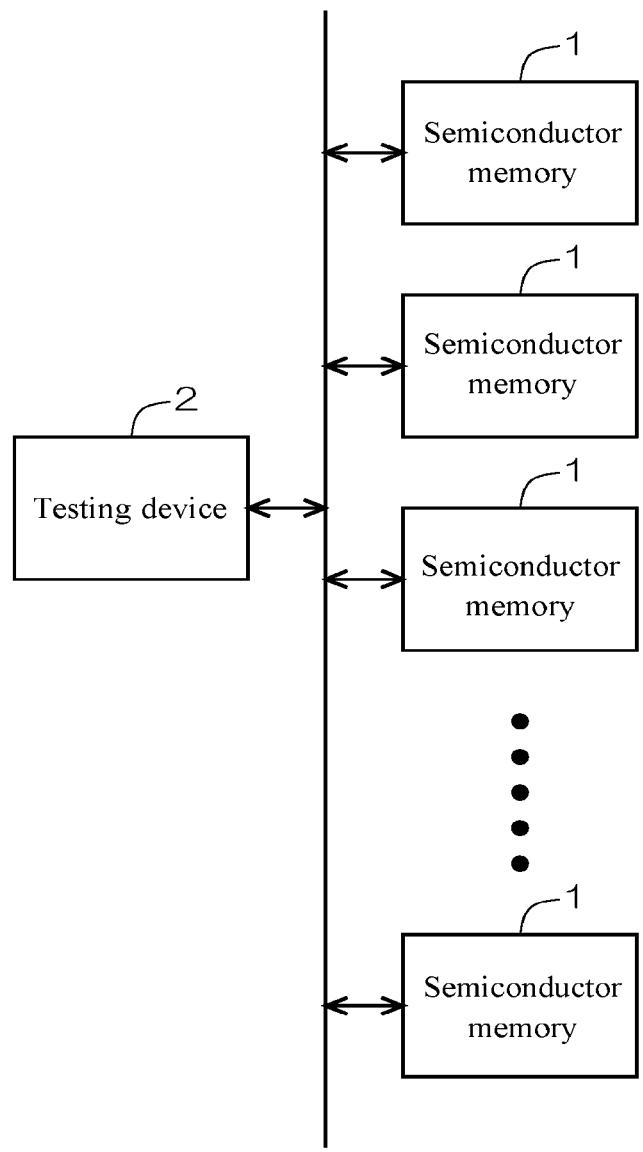
FIG. 1 is a diagram illustrating pre-shipment inspection conducted on a semiconductor memory according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically illustrated in order to simplify the drawing.

With semiconductor memories provided with a true random number generator for improving security, random number values of true random numbers are unpredictable, and thus multiple semiconductor memories cannot generate an identical true random number. Since expected values of the semiconductor memories vary with the random number values of true random numbers, pre-shipment inspection cannot be conducted concurrently on multiple semiconductor memories with one testing device, which consequently decreases productivity of pre-shipment inspection.

The present disclosure is directed to obtaining a memory device with increased productivity in pre-shipment inspection by realizing concurrent reliability tests on multiple memory devices, especially memory devices provided with a true random number generator, and a method for testing reliability of the same.

Generally proposed methods for random number evaluation include statistical testing such as "NIST Special Publication 800-22" and "DIEHARD". Performing complicated random number evaluation according to the statistical testing in random number test performed at shipment of semiconductor devices provided with a random number generator increases processing load of testing devices and also elongates time required for testing, resulting in increase in testing cost for pre-shipment inspection.

The present disclosure is also directed to obtaining a semiconductor device, semiconductor memory, and a method for testing reliability of a semiconductor device that achieve simple and efficient reliability test of a random number generator on a semiconductor device provided with a random number generator.

According to an aspect of the present disclosure, the memory controller performs a reliability test only on the memory array out of the memory array and the random number generator on receipt of a first test command from an external device, while performing a reliability test only on the random number generator out of the memory array and the random number generator on receipt of a second test command from the external device. Separately performing the reliability test of the memory array independent from the random number value of the true random number and the reliability test of the random number generator dependent on the random number value of the true random number enables concurrently performed reliability tests on multiple memory devices with one external device. In consequence, concurrent reliability tests on multiple memory devices are realized for memory devices provided with a true random number generator, which increase productivity of pre-shipment inspection.

In some embodiments of the memory device, the memory controller includes an encryption/decryption circuit configured to perform encryption and decryption on a signal transmitted to and from a host device based on a true random number generated by the random number generator. In a reliability test of the memory array, the memory controller is configured to input a predetermined fixed random number value in place of a true random number generated by the random number generator to the encryption/decryption circuit, and the encryption/decryption circuit is configured to perform encryption and decryption on a signal transmitted to and from the external device based on the fixed random number value.

According to such embodiments, in a reliability test of the memory array the memory controller inputs a predetermined fixed random number value in place of a true random number generated by the random number generator to the encryption/decryption circuit, and the encryption/decryption circuit performs encryption and decryption on a signal transmitted to and from the external device based on the fixed random number value. Such use of a predetermined fixed random number value in place of a true random number makes encryption and decryption by the encryption/decryption circuit in the reliability test of the memory array independent from a true random number generated by the random number generator. In consequence, employing a common fixed random number value for multiple memory devices enables use of a common expected value, which enables concurrently performed reliability test of the memory array on multiple memory devices.

In some embodiments of the memory device, the memory controller further includes a register for storing the fixed random number value, the fixed random number value being contained in the first test command. The memory controller is configured to extract the fixed random number value from the first test command received from the external device and store the fixed random number value in the register.

According to such embodiments, the memory controller extracts the fixed random number value from the first test command received from the external device and stores the fixed random number value in the register. Use of the fixed random number value stored in the register enables the encryption/decryption circuit to perform encryption and decryption independently from a true random number generated by the random number generator. Including the fixed random number value in the first test command facilitates changing the fixed random number value by the external device.

In some embodiments of the memory device, the memory controller further includes a register for storing the fixed random number value, the fixed random number value being stored in a predetermined storage in the memory device, the memory controller being configured to read the fixed random number value from the storage and store the fixed random number value in the register.

According to such embodiments, the fixed random number value is stored in a predetermined storage in the memory device. The memory controller stores the fixed random number value read from the storage in the register. Use of the fixed random number value stored in the register enables the encryption/decryption circuit to perform encryption and decryption independently from a true random number generated by the random number generator.

In some embodiments of the memory device, the memory controller includes a self-test circuit configured to perform a reliability test of the random number generator. The self-test circuit is configured to input a predetermined control signal to the random number generator to cause the random number generator to generate a random number value, store the random number value generated by the random number generator in a predetermined storage in the memory device, and check irreproducibility of the random number value generated by the random number generator based on the random number value read from the storage.

According to such embodiments, the self-test circuit inputs a predetermined control signal to the random number generator to cause the random number generator to generate a random number value, stores the random number value generated by the random number generator in a predetermined storage in the memory device, and checks irreproducibility of the random number value generated by the random number generator based on the random number value read from the storage. The reliability test of a random number generator dependent on the random number value of a true random number is performed as a self test for each memory device by the self-test circuit of each memory device, which enables concurrently performed reliability tests of a random number generator on multiple memory devices. Limiting the reliability test of a random number generator to irreproducibility check of the random number values facilitates the test and reduces testing cost. Applying the embodiment of the present disclosure to a device whose uniformity of random numbers is assured in a separate processing block from the random number generator is particularly effective.

In some embodiments of the memory device, the second test command contains count information for specifying a number of counts to cause the random number generator to generate a random number value. The self-test circuit is configured to extract the count information from the second test command and cause the random number generator to sequentially generate a plurality of random number values based on the count information.

According to such embodiments, the self-test circuit extracts the count information from the second test command and cause the random number generator to sequentially generate a plurality of random number values based on the count information. A plurality of random number values sequentially generated by the random number generator is thus stored in the storage. The self-test circuit reads the plurality of random number values from the storage, so as to check irreproducibility of the random number values. Including the count information in the second test command facilitates changing the count information by an external device.

In some embodiments of the memory device, a predetermined storage in the memory device is configured to store count information for specifying a number of counts to cause the random number generator to generate a random number value. The self-test circuit is configured to read the count information from the storage and cause the random number generator to sequentially generate a plurality of random number values based on the count information.

According to such embodiments, the count information is stored in a predetermined storage in the memory device. The self-test circuit causes the random number generator to sequentially generate a plurality of random number values based on the count information read from the storage. A plurality of random number values sequentially generated by the random number generator is thus stored in the storage. The self-test circuit reads the plurality of random number values from the storage, so as to check irreproducibility of the random number values.

In some embodiments of the memory device, the self-test circuit is configured to start checking of the random number values on receipt of input of the count information, and on completion of checking, send a check result to the external device.

According to such embodiments, the self-test circuit starts checking of the random number values on receipt of input of the count information, and on completion of checking, sends a check result to the external device. This negates the need for test pattern to be produced and comparison with an expected value by the external device regarding a reliability test of the random number generator, and thus processing load of the external device is reduced.

In some embodiments of the memory device, the self-test circuit is configured to check whether identical random number values are consecutively generated by the random number generator, as an irreproducibility check of a random number value.

According to such embodiments, the self-test checks whether identical random number values are consecutively generated by the random number generator, as an irreproducibility check of a random number value. This achieves a simple check of presence or absence of repetition of a random number.

In some embodiments of the memory device, the self-test circuit is configured to check whether identical random number values are included in a plurality of random number values generated by the random number generator, as an irreproducibility check of a random number value.

According to such embodiments, the self-test circuit checks whether identical random number values are included in a plurality of random number values generated by the random number generator, as an irreproducibility check of a random number value. This achieves a simple check of presence or absence of periodicity of a random number.

In some embodiments of the memory device, the self-test circuit is configured to check whether appearance rates of "0" and "1" in a random number value generated by the random number generator are within a predetermined allowable range, as an irreproducibility check of a random number value.

According to such embodiments, the self-test circuit checks whether appearance rates of "0" and "1" in a random number value generated by the random number generator are within a predetermined allowable range, as an irreproducibility check of a random number value. This achieves a simple check of presence or absence of non-uniform distribution of "0" and "1" in each bit of random numbers.

According to an aspect of a method for testing reliability of a memory device, reliability test only on the memory array out of the memory array and the random number generator is performed on receipt of a first test command from an external device, while reliability test only on the random number generator out of the memory array and the random number generator is performed on receipt of a second test command from the external device. Separately performing the reliability test of the memory array independent from the random number value of the true random number and the reliability test of the random number generator dependent on the random number value of the true random number enables concurrently performed reliability tests on multiple memory devices with one external device. In consequence, concurrent reliability tests on multiple memory devices are realized for memory devices provided with a true random number generator, which increase productivity of pre-shipment inspection.

In another aspect, a semiconductor device includes a random number generator configured to generate a random number, and a memory controller connected the random number generator. The memory controller includes a self-test circuit configured to perform a reliability test of the random number generator. The self-test circuit is configured to input a predetermined control signal to the random number generator to cause the random number generator to generate a random number value, and check irreproducibility of the random number value generated by the random number generator.

According to such aspect, the self-test circuit inputs a predetermined control signal to the random number generator to cause the random number generator to generate a random number value, and checks irreproducibility of the random number value generated by the random number generator. The self test performed by the self-test circuit enables a simple and efficient reliability test of a random number generator. Limiting the reliability test of a random number generator to irreproducibility check of the random number values facilitates the test and reduces testing cost. Applying the embodiment of the present disclosure to a device whose uniformity of random numbers is assured in a separate processing block from the random number generator is particularly effective.

Some embodiments of the semiconductor device further include a storage (such as memory array, internal register of the memory controller, or RAM). The self-test circuit is configured to store a random number value generated by the random number generator in the storage, and check irreproducibility of the random number value generated by the random number generator based on the random number value read from the storage.

According to such embodiments, the self-test circuit stores a random number value generated by the random number generator in the storage, and checks irreproducibility of the random number value generated by the random number generator based on the random number value read from the storage. Storing the random number value previously generated by the random number generator in the storage enables the self-test circuit to check irreproducibility regarding, for example, repetition, periodicity, and non-uniform distribution of the random numbers based on the random number value read from the storage.

In some embodiments of the semiconductor device, count information for specifying a number of counts to cause the random number generator to generate a random number value is contained in a test command received from an external device by the semiconductor device. The self-test circuit is configured to extract the count information from the test command and cause the random number generator to sequentially generate a plurality of random number values based on the count information.

According to such embodiments, the self-test circuit extracts the count information from the second test command and causes the random number generator to sequentially generate a plurality of random number values based on the count information. A plurality of random number values sequentially generated by the random number generator is thus stored in the storage. The self-test circuit reads the plurality of random number values from the storage, so as to check irreproducibility of the random number values. Including the count information in the test command facilitates changing the count information by an external device.

In some embodiments of the semiconductor device, the count information for specifying a number of counts to cause the random number generator to generate a random number value is stored in a predetermined storage in the semiconductor device. The self-test circuit is configured to read the count information from the storage and cause the random number generator to sequentially generate a plurality of random number values based on the count information.

According to such embodiments, the count information is stored in a predetermined storage in the semiconductor device. The self-test circuit causes the random number generator to sequentially generate a plurality of random number values based on the count information read from the storage. A plurality of random number values sequentially generated by the random number generator is thus stored in the storage. The self-test circuit reads the plurality of random number values from the storage, so as to check irreproducibility of the random number values.

In some embodiments of the semiconductor device, the self-test circuit is configured to start checking of the random number values on receipt of input of the count information, and on completion of checking, send a check result to the external device.

According to such embodiments, the self-test circuit starts checking of the random number values on receipt of input of the count information, and on completion of checking, sends a check result to the external device. This negates the need for test pattern to be produced and comparison with an expected value by the external device regarding a reliability test of the random number generator, and thus processing load of the external device is reduced.

In some embodiments of the semiconductor device, the self-test circuit is configured to check whether identical random number values are consecutively generated by the random number generator, as an irreproducibility check of a random number value.

According to such embodiments, the self-test checks whether identical random number values are consecutively generated by the random number generator, as an irreproducibility check of a random number value. This achieves a simple check of presence or absence of repetition of a random number.

In some embodiments of the semiconductor device, the self-test circuit is configured to check whether identical random number values are included in a plurality of random number values generated by the random number generator, as an irreproducibility check of a random number value.

According to such embodiments, the self-test circuit checks whether identical random number values are included in a plurality of random number values generated by the random number generator, as an irreproducibility check of a random number value. This achieves a simple check of presence or absence of periodicity of a random number.

In some embodiments of the semiconductor device, the self-test circuit is configured to check whether appearance rates of "0" and "1" in a random number value generated by the random number generator are within a predetermined allowable range, as an irreproducibility check of a random number value.

According to such embodiments, the self-test circuit checks whether appearance rates of "0" and "1" in a random number value generated by the random number generator are within a predetermined allowable range, as an irreproducibility check of a random number value. This achieves a simple check of presence or absence of non-uniform distribution of "0" and "1" in each bit of random numbers.

In another aspect, a semiconductor memory includes a random number generator configured to generate a random number, a memory controller connected to the random number generator, and a storage. The memory controller includes a self-test circuit configured to perform a reliability test of the random number generator. The self-test circuit is configured to input a predetermined control signal to the random number generator to cause the random number generator to generate a random number value, store the random number value generated by the random number generator in the storage, and check irreproducibility of the random number value generated by the random number generator based on the random number value read from the storage.

According to such aspect, the self-test circuit inputs a predetermined control signal to the random number generator to cause the random number generator to generate a random number value, stores the random number value generated by the random number generator in the storage (such as memory array, internal register of the memory controller, or RAM), and checks irreproducibility of the random number value generated by the random number generator based on the random number value read from the storage. The self test performed by the self-test circuit enables a simple and efficient reliability test of a random number generator. Storing the random number value previously generated by the random number generator in the storage enables the self-test circuit to check irreproducibility regarding, for example, repetition, periodicity, and non-uniform distribution of the random numbers based on the random number value read from the storage. Limiting the reliability test of a random number generator to irreproducibility check of the random number values facilitates the test and reduces testing cost. Applying the embodiment of the present disclosure to a device whose uniformity of random numbers is assured in a separate processing block from the random number generator is particularly effective.

A method according to another aspect is a method for testing reliability of a semiconductor device, the semiconductor device including a random number generator configured to generate a random number, and a self-test circuit configured to perform a reliability test of the random number generator, the method including inputting a predetermined control signal to the random number generator by the self-test circuit to cause the random number generator to generate a random number value, and checking irreproducibility of the random number value generated by the random number generator by the self-test circuit.

According to such aspect, the self-test circuit inputs a predetermined control signal to the random number generator to cause the random number generator to generate a random number value, and checks irreproducibility of the random number value generated by the random number generator. The self test performed by the self-test circuit enables a simple and efficient reliability test of a random number generator. Limiting the reliability test of a random number generator to irreproducibility check of the random number values facilitates the test and reduces testing cost. Applying the embodiment of the present disclosure to a device whose uniformity of random numbers is assured in a separate processing block from the random number generator is particularly effective.

According to the present disclosure, concurrent reliability tests on multiple memory devices are realized for memory devices provided with a true random number generator, which increase productivity of pre-shipment inspection.

Some embodiments of the present disclosure enable a simple and efficient reliability test of a random number generator on a memory device provided with a random number generator.

Description of Embodiments

Embodiments of the present disclosure are described in detail below referring to the drawings. It should be noted that identical reference numerals throughout the drawings indicate identical or equivalent elements.

FIG. 1 is a diagram illustrating pre-shipment inspection conducted on a semiconductor memory 1 according to an embodiment of the present disclosure. Multiple semiconductor memories 1 are connected to one testing device 2, so that reliability test is concurrently performed on the multiple semiconductor memories (semiconductor devices) 1. The semiconductor memory 1 is, for example, a memory card configured to be detachably connected to a host device. Alternatively, an arbitrary memory device such as an optical disc or a magnetic disk can replace the memory card. In place of the testing device 2, an arbitrary external device such as a simple testing device or a host device having a test function may be employed to perform a reliability test of the semiconductor memory 1.

Figure 2:
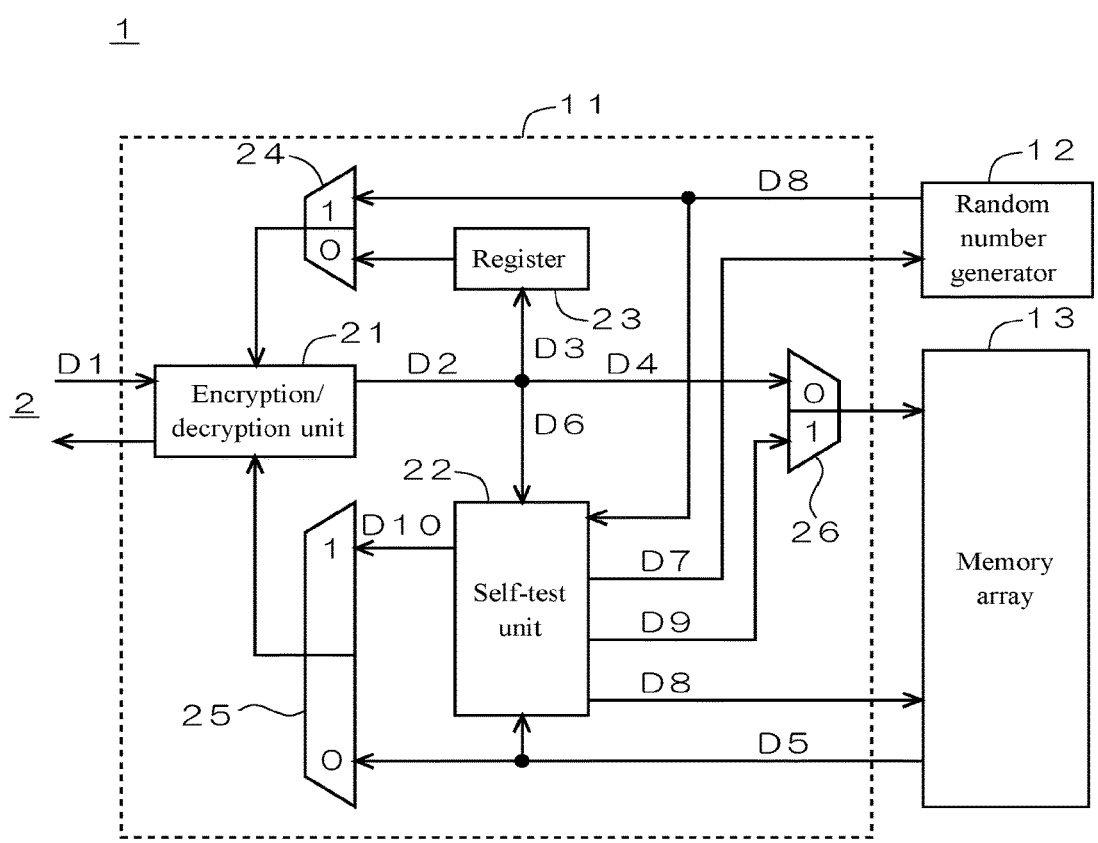
FIG. 2 is a diagram illustrating a configuration of the semiconductor memory.

FIG. 2 is a diagram illustrating a configuration of the semiconductor memory 1. The semiconductor memory 1 includes a memory controller 11, a random number generator 12 that generates a true random number with an uncertain circuit, and a memory array 13 with a NAND type flash memory.

FIG. 2 illustrates connections in the memory controller 11 between an encryption/decryption unit 21, a self-test unit 22, a register 23, and selectors 24 to 26. The encryption/decryption unit 21 and the self-test unit 22 may comprise suitable logic, circuitry, interfaces and/or code.

Figure 3:
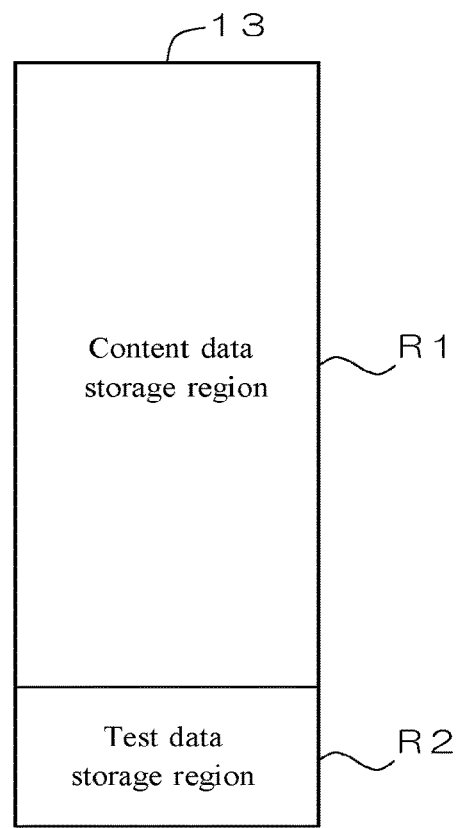
FIG. 3 is a diagram illustrating memory regions of a memory array.

FIG. 3 is a diagram illustrating memory regions of the memory array 13. The memory array 13 includes a content data storage region R1 for storing content data and a test data storage region R2 for storing test data.

Figure 4:
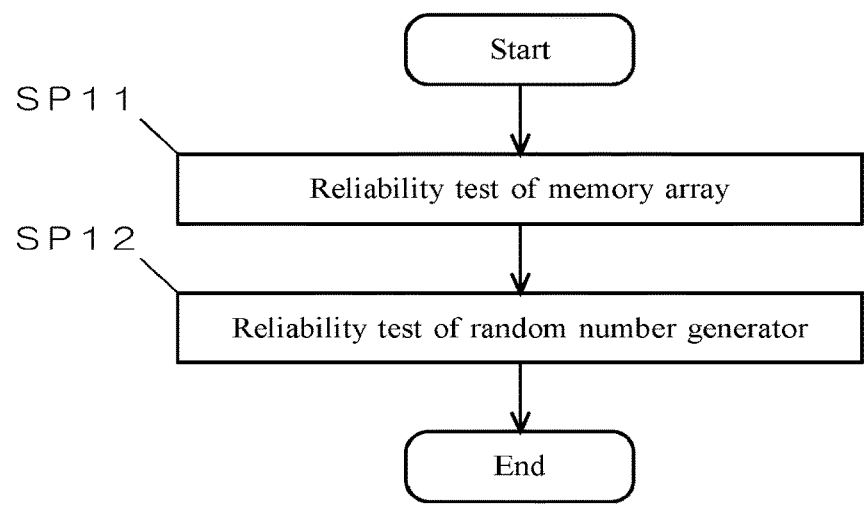
FIG. 4 is a flow chart illustrating the sequence of a reliability test on the semiconductor memory.

FIG. 4 is a flow chart illustrating the sequence of a reliability test on the semiconductor memory 1. In Step SP11, the testing device 2 performs a reliability test of the memory array 13 (hereinafter, "memory test"). On completion of the memory test, in Step SP12, the testing device 2 performs a reliability test of the random number generator 12 (hereinafter, "random number test"). In this way, the memory and the random number tests are performed separately and chronologically on the semiconductor memory 1. The order in which the memory and the random number tests are performed may be the opposite of the example illustrated in FIG. 4.

Reliability Test of Memory Array

Figure 5:
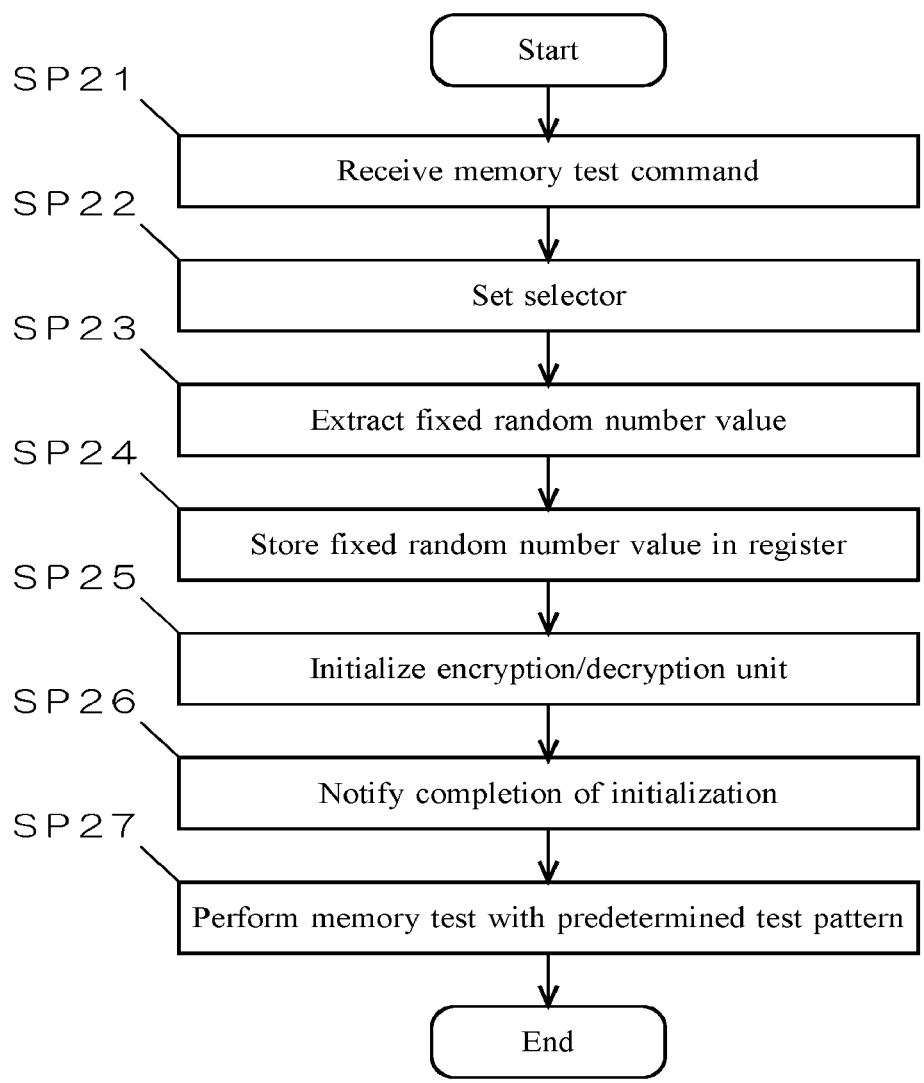
FIG. 5 is a flow chart illustrating the sequence of a memory test by a memory controller.

FIG. 5 is a flow chart illustrating the sequence of a memory test by the memory controller 11. In a memory test in pre-shipment inspection, the testing device 2 firstly generates a predetermined fixed random number value to be used by the encryption/decryption unit 21 in the memory test, and then generates a test pattern and its expected value. The testing device 2 next stores the fixed random number value in a test command dedicated to instruct to perform a memory test (hereinafter, "memory test command"), and then encrypts the memory test command with a known cryptographic algorithm for a test mode. The encrypted memory test command is sent as data D1 to the semiconductor memory 1. Encryption of the memory test command may be omitted.

Referring to FIG. 5, in Step SP 21, the memory controller 11 receives the encrypted memory test command from the testing device 2. The received encrypted memory test command is decrypted with the cryptographic algorithm for the test mode by the encryption/decryption unit 21. The encryption/decryption unit 21 outputs the decrypted memory test command as data D2.

In Step SP22, the memory controller 11 recognizes a receipt of the memory test command from the testing device 2 by a command ID, and switches the input terminal of the selectors 24 to 26 to "0" as in FIG. 2.

In Step SP23, the memory controller 11 extracts the fixed random number value from the memory test command output from the encryption/decryption unit 21 in Step SP21.

In Step SP24, the memory controller 11 inputs the fixed random number value extracted in Step SP23 as data D3 to the register 23. The fixed random number value is thereby stored in the register 23.

In Step SP25, the memory controller 11 inputs the fixed random number value stored in the register 23 to the encryption/decryption unit 21 via the selector 24. The memory controller 11 then initializes the encryption/decryption unit 21 with the fixed random number value.

In Step SP26, the memory controller 11 notifies the testing device 2 as a return value to the memory test command that the encryption/decryption unit 21 has been initialized.

In Step SP27, the memory controller 11 performs a reliability test of the memory array 13 with the test pattern generated by the testing device 2. For example, the testing device 2 sends an encrypted test pattern encrypted with the fixed random number value to the semiconductor memory 1. The memory controller 11 decrypts the encrypted test pattern received from the testing device 2 by means of the encryption/decryption unit 21 with the fixed random number value. The memory controller 11 inputs an address included in the decrypted test pattern as data D4 to the memory array 13 via the selector 26. The memory controller 11 inputs data D5 read from the memory array 13 to the encryption/decryption unit 21 via the selector 25. The memory controller 11 encrypts the data D5 by means of the encryption/decryption unit 21 with the fixed random number value, and sends the encrypted data to the testing device 2.

The testing device 2 decrypts the encrypted data received from the semiconductor memory 1 with the fixed random number value. The value of the decrypted data is compared with the expected value of the test pattern generated above, so as to evaluate the reliability of the memory array 13.

Description is given above of an example of sending a fixed random number value included in a memory test command from the testing device 2 to the semiconductor memory 1. Embodiments, however, are not limited to this example. In another example, a fixed random number value may be stored in an arbitrary storage (such as the memory array 13, a RAM, a ROM, or a register) in the semiconductor memory 1 in advance. In this example, the memory controller 11 receives a memory test command from the testing device 2, and then a fixed random number value is read from the storage and stored in the register 23.

Reliability Test of a Random Number Generator (First Example: Evaluation of Repetition of a Random Number)

Figure 6:
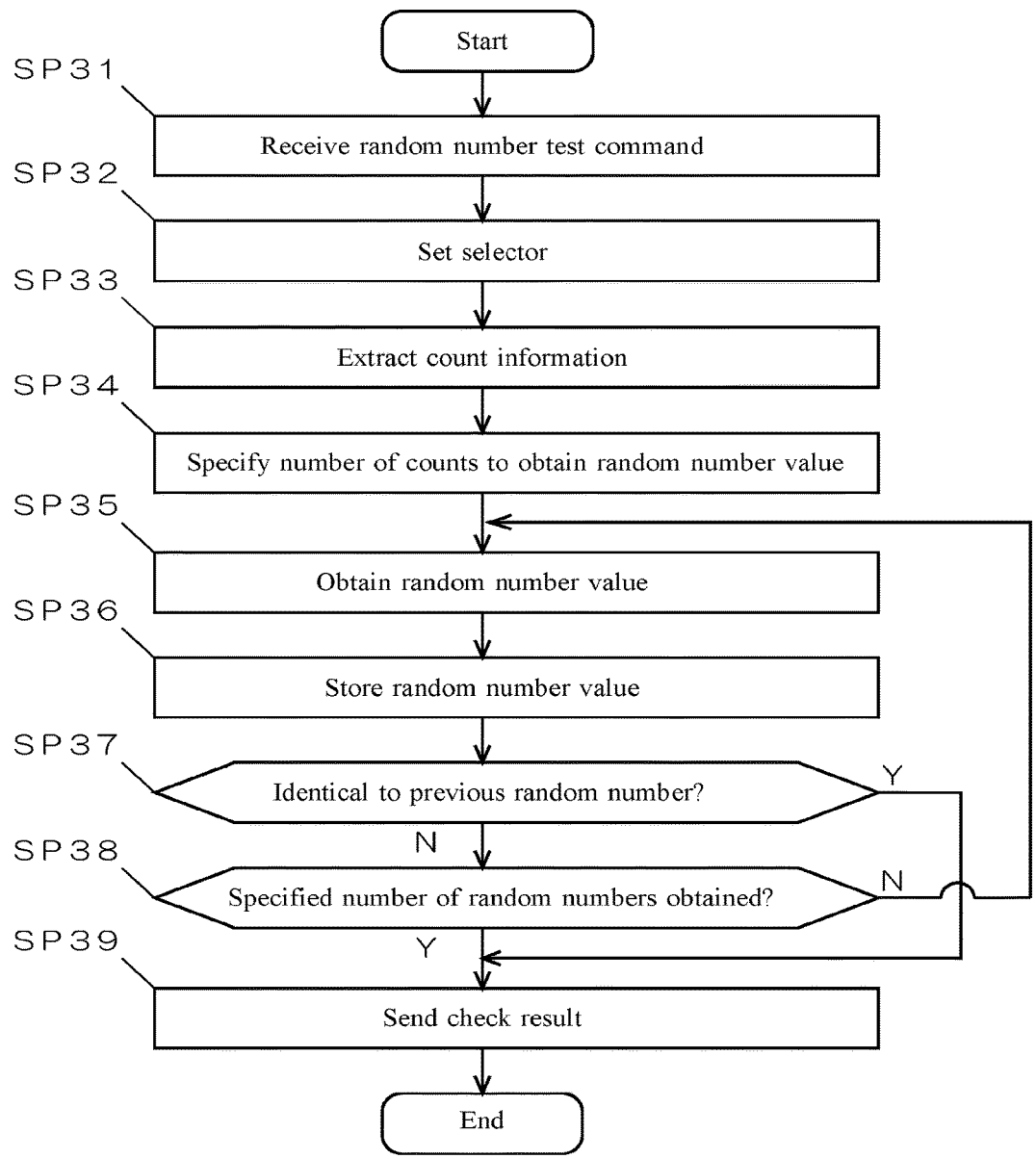
FIG. 6 is a flow chart illustrating the sequence of a random number test by the memory controller.

FIG. 6 is a flow chart illustrating the sequence of a random number test by the memory controller 11. In a random number test in pre-shipment inspection, the testing device 2 firstly generates count information to specify the number of counts to obtain a random number value from the random number generator 12. The testing device 2 next stores the count information in a test command dedicated to instruct to perform a random number test (hereinafter, "random number test command"), and then encrypts the random number test command with a known cryptographic algorithm for a test mode. The encrypted random number test command is sent as data D1 to the semiconductor memory 1. Encryption of the random number test command may be omitted.

Referring to FIG. 6, in Step SP31, the memory controller 11 receives the encrypted random number test command from the testing device 2. The received encrypted random number test command is decrypted with the cryptographic algorithm for the test mode by the encryption/decryption unit 21. The encryption/decryption unit 21 outputs the decrypted random number test command as data D2.

In Step SP32, the memory controller 11 recognizes a receipt of the random number test command from the testing device 2 by a command ID, and switches the input terminal of the selectors 24 to 26 to "1" as in FIG. 2.

In Step SP33, the memory controller 11 extracts the count information from the random number test command output from the encryption/decryption unit 21 in Step SP31.

In Step SP34, the memory controller 11 inputs the count information extracted in Step SP33 as data D6 to the self-test unit 22. The number of counts to obtain the random number value from the random number generator 12 is thereby specified to the self-test unit 22.

In Step SP35, the memory controller 11 inputs a control signal D7 to instruct the random number generator 12 to generate a random number value from the self-test unit 22 to the random number generator 12. The random number generator 12 receives the input of the control signal D7 and generates a random number value D8. The memory controller 11 then inputs the random number value D8 output from the random number generator 12 to the self-test unit 22.

In Step SP36, the memory controller 11 inputs an address D9 in the test data storage region R2 for storing the random number value D8 from the self-test unit 22 via the selector 26 to the memory array 13. The memory controller 11 inputs the random number value D8 obtained in Step SP35 from the self-test unit 22 to the memory array 13. The random number value D8 obtained in Step SP35 is thereby stored at a specified address in the test data storage region R2.

In Step SP37, the memory controller 11 reads the random number value D8 previously generated and stored in the memory array 13 from the memory array 13 to the self-test unit 22. The memory controller 11 then compares the latest random number value D8 obtained in Step SP35 (hereinafter, "new random number value") with the previous random number value D8 read from the memory array 13 (hereinafter, "old random number value") by means of the self-test unit 22.

If the result of comparison in Step SP37 shows the new random number value D8 and the old random number value D8 are identical, in Step SP39, the memory controller 11 inputs a check result indicating that identical random number values are consecutively generated by the random number generator 12 (that is, a check result indicating occurrence of repetition of a random number) as data D10 from the self-test unit 22 via the selector 25 to the encryption/decryption unit 21. The memory controller 11 encrypts the check result with the cryptographic algorithm for a test mode by means of the encryption/decryption unit 21 and then sends it to the testing device 2. The testing device 2 decrypts the encrypted check result received from the semiconductor memory 1 with the cryptographic algorithm for the test mode, and evaluates the reliability of the random number generator 12 (in this case, occurrence of repetition of the random number).

If the result of comparison in Step SP37 shows the new random number value D8 and the old random number value D8 are not identical, in Step SP39, the memory controller 11 determines whether the random number values D8 have been obtained for the number of counts specified by the count information by means of the self-test unit 22.

If the random number values D8 have not been obtained for the specified number of counts, the memory controller 11 repeats the processing from Step SP35 onward.

If the random number values D8 have been obtained for the specified number of counts, in Step SP39, the memory controller 11 inputs a check result indicating no occurrence of repetition of a random number as data D10 from the self-test unit 22 via the selector 25 to the encryption/decryption unit 21. The memory controller 11 encrypts the check result with the cryptographic algorithm of the test mode by means of the encryption/decryption unit 21, and then sends it to the testing device 2. The testing device 2 decrypts the encrypted check result received from the semiconductor memory 1 with the cryptographic algorithm for the test mode, and evaluates the reliability of the random number generator 12 (in this case, no occurrence of the repetition of the random number).

Description is given above of an example of sending count information included in a random number test command from the testing device 2 to the semiconductor memory 1. Embodiments, however, are not limited to this example. In another example, count information may be stored in an arbitrary storage (such as the memory array 13, a RAM, a ROM, or a register) in the semiconductor memory 1 in advance. In this example, the memory controller 11 receives a random number test command from the testing device 2, and then count information is read from the storage and input to the self-test unit 22. This is similarly applicable to second and third examples below.

Moreover, description is given above of an example of storing the old random number value D8 in the test data storage region R2 in the memory array 13. Embodiments, however, are not limited to this example. The old random number value D8 may be stored in, for example, an internal register or RAM in the memory controller 11. This is similarly applicable to second and third examples below.

Reliability Test of a Random Number Generator (Second Example: Evaluation of Periodicity of a Random Number)

Figure 7:
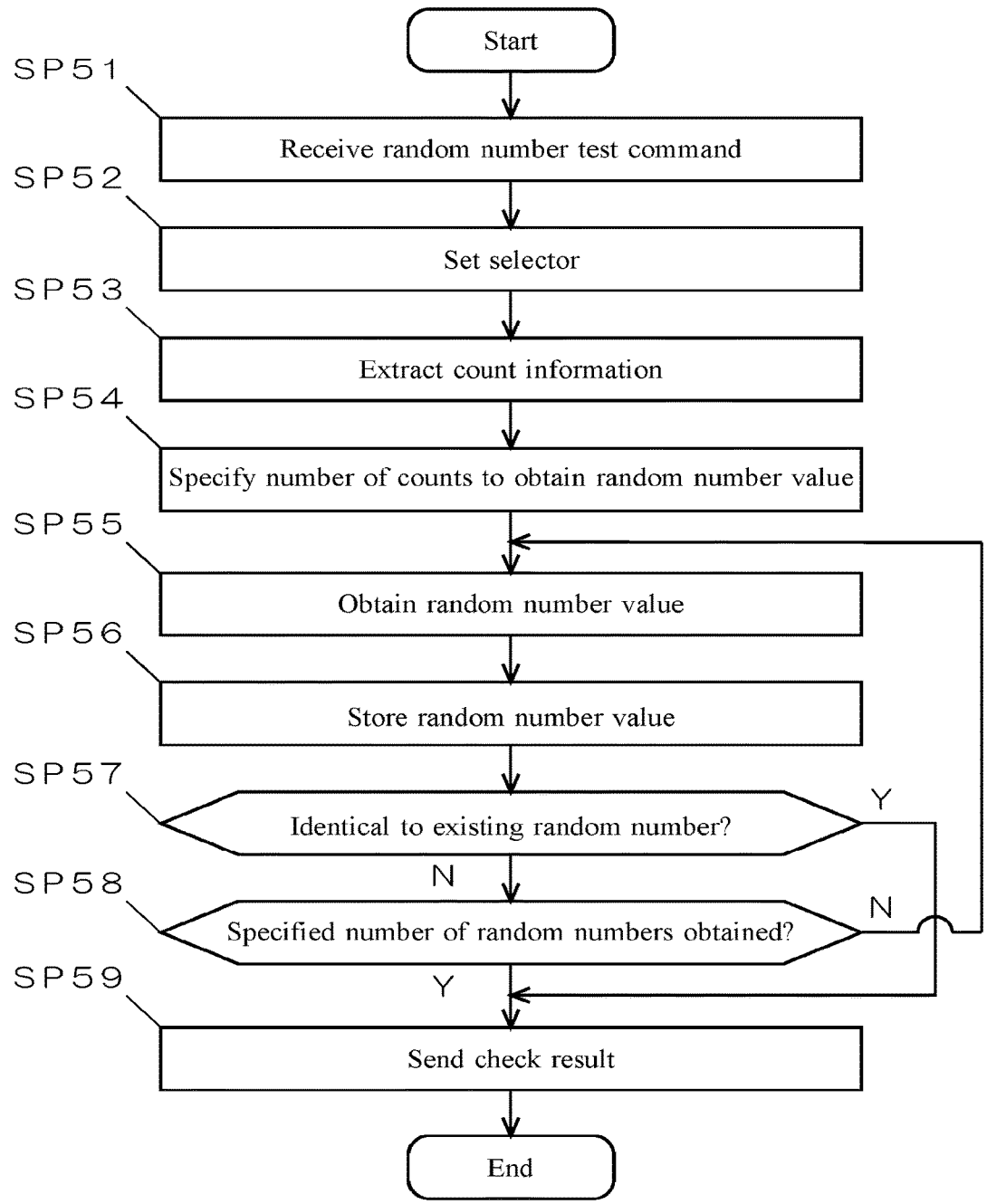
FIG. 7 is a flow chart illustrating the sequence of a random number test by the memory controller.

FIG. 7 is a flow chart illustrating the sequence of a random number test by the memory controller 11. In a random number test in pre-shipment inspection, the testing device 2 firstly generates count information to specify the number of counts to obtain a random number value from the random number generator 12. The testing device 2 next stores the count information in the random number test command, and then encrypts the random number test command with a known cryptographic algorithm for a test mode. The encrypted random number test command is sent as data D1 to the semiconductor memory 1. Encryption of the random number test command may be omitted.

Referring to FIG. 7, in Step SP51, the memory controller 11 receives the encrypted random number test command from the testing device 2. The received encrypted random number test command is decrypted with the cryptographic algorithm for the test mode by the encryption/decryption unit 21. The encryption/decryption unit 21 outputs the decrypted random number test command as data D2.

In Step SP52, the memory controller 11 recognizes a receipt of the random number test command from the testing device 2 by a command ID, and switches the input terminal of the selectors 24 to 26 to "1" as in FIG. 2.

In Step SP53, the memory controller 11 extracts the count information from the random number test command output from the encryption/decryption unit 21 in Step SP51.

In Step SP54, the memory controller 11 inputs the count information extracted in Step SP53 as data D6 to the self-test unit 22. The number of counts to obtain the random number value from the random number generator 12 is thereby specified to the self-test unit 22.

In Step SP55, the memory controller 11 inputs a control signal D7 to instruct the random number generator 12 to generate a random number value from the self-test unit 22 to the random number generator 12. The random number generator 12 receives the input of the control signal D7 and generates a random number value D8. The memory controller 11 then inputs the random number value D8 output from the random number generator 12 to the self-test unit 22.

In Step SP56, the memory controller 11 inputs an address D9 in the test data storage region R2 for storing the random number value D8 from the self-test unit 22 via the selector 26 to the memory array 13. The memory controller 11 inputs the random number value D8 obtained in Step SP55 from the self-test unit 22 to the memory array 13. The random number value D8 obtained in Step SP55 is thereby stored at a specified address in the test data storage region R2.

In Step SP57, the memory controller 11 reads all the random number values D8 stored in the memory array 13 at that moment from the memory array 13 to the self-test unit 22. The memory controller 11 then compares the latest random number value D8 obtained in Step SP55 (hereinafter, "new random number value") with the existing random number values D8 read from the memory array 13 (hereinafter, "existing random number value") by means of the self-test unit 22.

If the result of comparison in Step SP57 shows the new random number value D8 is identical to any of the existing random number values D8, in Step SP59, the memory controller 11 inputs a check result indicating that a random number value is duplicated by the random number generator 12 (that is, a check result indicating occurrence of periodicity of a random number) as data D10 from the self-test unit 22 via the selector 25 to the encryption/decryption unit 21. The memory controller 11 encrypts the check result with the cryptographic algorithm for a test mode by means of the encryption/decryption unit 21 and then sends it to the testing device 2. The testing device 2 decrypts the encrypted check result received from the semiconductor memory 1 with the cryptographic algorithm for the test mode, and evaluates the reliability of the random number generator 12 (in this case, occurrence of periodicity of the random number).

If the result of comparison in Step SP57 shows the new random number value D8 is identical to none of the existing random number values D8, in Step SP58, the memory controller 11 determines whether the random number values D8 have been obtained for the number of counts specified by the count information by means of the self-test unit 22.

If the random number values D8 have not been obtained for the specified number of counts, the memory controller 11 repeats the processing from Step SP55 onward.

If the random number values D8 have been obtained for the specified number of counts, in Step SP59, the memory controller 11 inputs a check result indicating no occurrence of periodicity of a random number as data D10 from the self-test unit 22 via the selector 25 to the encryption/decryption unit 21. The memory controller 11 encrypts the check result with the cryptographic algorithm for a test mode by means of the encryption/decryption unit 21 and then sends it to the testing device 2. The testing device 2 decrypts the encrypted check result received from the semiconductor memory 1 with the cryptographic algorithm for the test mode, and evaluates the reliability of the random number generator 12 (in this case, no occurrence of the periodicity of the random number).

Reliability Test of a Random Number Generator (Third Example: Evaluation of Non-uniform Distribution of Random Numbers)

Figure 8:
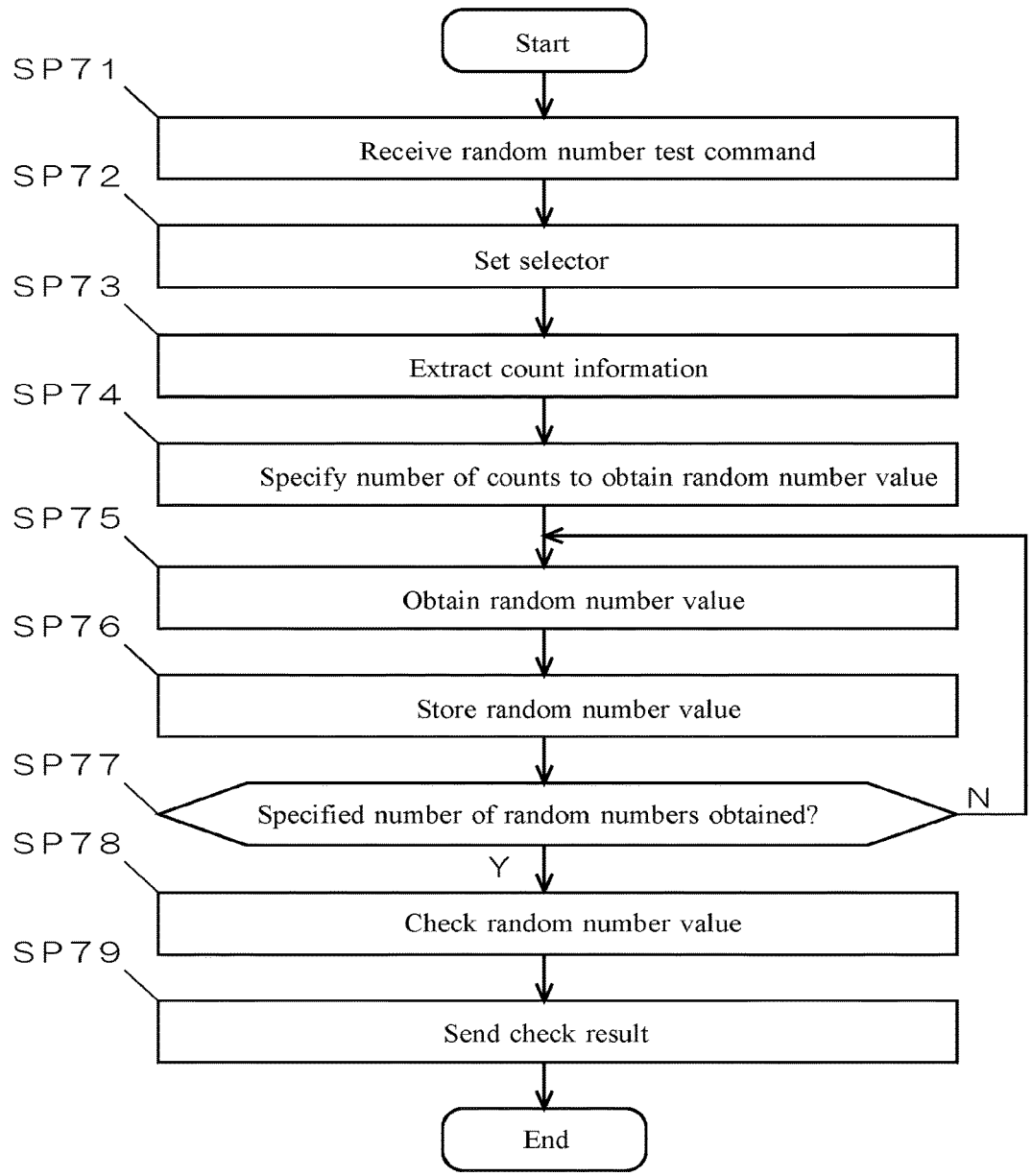
FIG. 8 is a flow chart illustrating the sequence of a random number test by the memory controller.

FIG. 8 is a flow chart illustrating the sequence of a random number test by the memory controller 11. In a random number test in pre-shipment inspection, the testing device 2 firstly generates count information to specify the number of counts to obtain a random number value from the random number generator 12. The testing device 2 next stores the count information in the random number test command, and then encrypts the random number test command with a known cryptographic algorithm for a test mode. The encrypted random number test command is sent as data D1 to the semiconductor memory 1. Encryption of the random number test command may be omitted.

Referring to FIG. 8, in Step SP71, the memory controller 11 receives the encrypted random number test command from the testing device 2. The received encrypted random number test command is decrypted with the cryptographic algorithm for the test mode by the encryption/decryption unit 21. The encryption/decryption unit 21 outputs the decrypted random number test command as data D2.

In Step SP72, the memory controller 11 recognizes a receipt of the random number test command from the testing device 2 by a command ID, and switches the input terminal of the selectors 24 to 26 to "1" in FIG. 2.

In Step SP73, the memory controller 11 extracts the count information from the random number test command output from the encryption/decryption unit 21 in Step SP71.

In Step SP74, the memory controller 11 inputs the count information extracted in Step SP73 as data D6 to the self-test unit 22. The number of counts to obtain the random number value from the random number generator 12 is thereby specified to the self-test unit 22.

In Step SP75, the memory controller 11 inputs a control signal D7 to instruct the random number generator 12 to generate a random number value from the self-test unit 22 to the random number generator 12. The random number generator 12 receives the input of the control signal D7 and generates a random number value D8. The memory controller 11 then inputs the random number value D8 output from the random number generator 12 to the self-test unit 22.

In Step SP76, the memory controller 11 inputs an address D9 in the test data storage region R2 for storing the random number value D8 from the self-test unit 22 via the selector 26 to the memory array 13. The memory controller 11 inputs the random number value D8 obtained in Step SP75 from the self-test unit 22 to the memory array 13. The random number value D8 obtained in Step SP75 is thereby stored at a specified address in the test data storage region R2.

In Step SP77, the memory controller 11 determines whether the random number values D8 have been obtained for the number of counts specified by the count information by means of the self-test unit 22.

If the random number values D8 have not been obtained for the specified number of counts, the memory controller 11 repeats the processing from Step SP75 onward.

If the random number values D8 have been obtained for the specified number of counts, in Step SP78, the memory controller 11 reads all the random number values D8 stored in the memory array 13 from the memory array 13 to the self-test unit 22. The memory controller 11 then checks whether non-uniform distribution of "0" and "1" occurs in each bit of the random number values D8 by means of the self-test unit 22. For example, given that the bit length of each random number value D8 is 128 bits and the specified number of counts is 64, the self-test unit 22 determines that non-uniform distribution does not occur if the number of "0"s or "1"s among the total of 128×64 bits is within an allowable range of at least 50×64 and not more than 70×64, while determining that non-uniform distribution occurs if the number is out of the allowable range.

In Step SP79, the memory controller 11 inputs a check result indicating whether non-uniform distribution of random numbers occur, as data D10 from the self-test unit 22 via the selector 25 to the encryption/decryption unit 21. The memory controller 11 encrypts the check result with the cryptographic algorithm for a test mode by means of the encryption/decryption unit 21 and then sends it to the testing device 2. The testing device 2 decrypts the encrypted check result received from the semiconductor memory 1 with the cryptographic algorithm for the test mode, and evaluates the reliability of the random number generator 12 (in this case, occurrence of non-uniform distribution of the random numbers).

Description is given above of an example of storing the random number value D8 in the specified number of counts in the test data storage region R2 in the memory array 13. Embodiments, however, are not limited to this example. Storing the random number values D8 in the memory array 13 may be omitted, by counting the bit number of "0" s or "1" s with the random number values D8 being stored in an internal register of the memory controller 11 and accumulating count values every time a new random number value D8 is generated.

The first to third examples above regarding the reliability test of the random number generator 12 may be applicable in an arbitrary combination.

Recapitulation

In the semiconductor memory (semiconductor device) 1 according to the present embodiment, the memory controller 11 performs a reliability test only on the memory array 13 (memory test) out of the memory array 13 and the random number generator 12 on receipt of a memory test command from the testing device 2, while performing a reliability test only on the random number generator 12 (random number test) out of the memory array 13 and the random number generator 12 on receipt of a random number test command from the testing device 2. Separately performing the reliability test of the memory array 13 independent from the random number value of the true random number and the reliability test of the random number generator 12 dependent on the random number value of the true random number enables concurrently performed reliability tests on multiple semiconductor memories 1 with one testing device 2. In consequence, concurrent reliability tests on multiple semiconductor memories 1 are realized for the semiconductor memory 1 provided with the random number generator 12 that generates true random number, which increases productivity of pre-shipment inspection.

In the semiconductor memory 1 according to the present embodiment, in the reliability test of the memory array 13, the memory controller 11 inputs a predetermined fixed random number value in place of a true random number generated by the random number generator 12 to the encryption/decryption unit 21, and the encryption/decryption unit 21 encrypts and decrypts signals (command and data) transmitted to and from the testing device 2 on the basis of the fixed random number value. Such use of a predetermined fixed random number value in place of a true random number makes encryption and decryption by the encryption/decryption unit 21 in the reliability test of the memory array 13 independent from a true random number generated by the random number generator 12. In consequence, employing a common fixed random number value for multiple semiconductor memories 1 enables use of a common expected value, which enables concurrently performed reliability test of the memory array 13 on multiple semiconductor memories 1.

In the semiconductor memory 1 according to the present embodiment, the memory controller 11 extracts the fixed random number value from the memory test command (first test command) received from the testing device 2 and stores the fixed random number value in the register 23. Use of the fixed random number value stored in the register 23 enables the encryption/decryption unit 21 to perform encryption and decryption independently from a true random number generated by the random number generator 12. Including the fixed random number value in the memory test command facilitates changing the fixed random number value by the testing device 2.

In the semiconductor memory 1 according to the present embodiment, the fixed random number value is stored in a predetermined storage in the semiconductor memory 1, and the memory controller 11 stores the fixed random number value read from the storage in the register 23. Use of the fixed random number value stored in the register 23 enables the encryption/decryption unit 21 to perform encryption and decryption independently from a true random number generated by the random number generator 12.

In the semiconductor memory 1 according to the present embodiment, the self-test unit 22 inputs a predetermined control signal D7 to the random number generator 12 to cause the random number generator 12 to generate the random number value D8, store the random number value D8 generated by the random number generator 12 in a predetermined storage in the semiconductor memory 1 (such as memory array 13, RAM, ROM, or register), and checks irreproducibility of the random number value D8 generated by the random number generator 12 on the basis of the random number value D8 read from the storage. The reliability test of the random number generator 12 dependent on the random number value of a true random number is performed as a self test for each semiconductor memory 1 by the self-test unit 22 of each semiconductor memory 1, which enables concurrently performed reliability tests of a random number generator on multiple semiconductor memories 1. Limiting the reliability test of the random number generator 12 to irreproducibility check of the random number value facilitates the test and reduces testing cost.

General random number tests need to check whether a generated random number meets both irreproducibility and uniformity. Such complicated random number test at pre-shipment inspection increases testing cost. In the semiconductor memory 1 according to the present embodiment, the reliability test of the random number generator 12 is limited to the irreproducibility check of random number values, which facilitates the test and reduces testing cost. On the other hand, since uniformity check is not performed in the reliability test of the random number generator 12, applying the embodiment of the present disclosure to a device whose uniformity of random numbers is assured in a separate processing block from the random number generator is particularly effective. In the semiconductor memory 1 according to the present embodiment, the uniformity of random numbers can be assured by a cryptographic algorithm of the encryption/decryption unit 21, so that the reliability test of the random number generator 12 may be limited to the irreproducibility check of random numbers.

In the semiconductor memory 1 according to the present embodiment, the self-test unit 22 extracts count information from the random number test command (second test command), and causes the random number generator 12 to sequentially generate multiple random number values D8 on the basis of the count information. Multiple random number values D8 sequentially generated by the random number generator 12 are thus stored in the storage. The self-test unit 22 reads the multiple random number values D8 from the storage, so as to check irreproducibility of the random number values. Including the count information in the random number test command facilitates changing the count information by the testing device 2.

In the semiconductor memory 1 according to the present embodiment, count information is stored in a predetermined storage in the semiconductor memory 1 (such as memory array 13, RAM, ROM, or register). The self-test unit 22 causes the random number generator 12 to sequentially generate multiple random number values D8, on the basis of the count information read from the storage. Multiple random number values D8 sequentially generated by the random number generator 12 are thus stored in the storage. The self-test unit 22 reads the multiple random number values D8 from the storage, so as to check irreproducibility of the random number value.

In the semiconductor memory 1 according to the present embodiment, the self-test unit 22 starts checking the random number value D8 on receipt of input of count information, and on completion of checking, sends a check result (data D10) to the testing device 2. This negates the need for test pattern to be produced and comparison with an expected value by the testing device 2 regarding a reliability test of the random number generator 12, and thus processing load of the testing device 2 is reduced.

In the semiconductor memory 1 according to the present embodiment, the self-test unit 22 checks whether identical random number values are consecutively generated by the random number generator 12, as an irreproducibility check of random number values. This achieves a simple check of presence or absence of repetition of a random number.

In the semiconductor memory 1 according to the present embodiment, the self-test unit 22 checks whether identical random number values are included in multiple random number values generated by the random number generator 12, as an irreproducibility check of random number values. This achieves a simple check of presence or absence of periodicity of a random number.

In the semiconductor memory 1 according to the present embodiment, the self-test unit 22 checks whether appearance rates of "0" and "1" in a random number value generated by the random number generator 12 are within a predetermined allowable range, as an irreproducibility check of random number values. This achieves a simple check of presence or absence of non-uniform distribution of "0" and "1" in each bit of random numbers.

In the semiconductor memory 1 according to the present embodiment, the self-test unit 22 stores the random number value D8 generated by the random number generator 12 in a storage (such as memory array 13, internal register of the memory controller 11, or RAM), and checks irreproducibility of the random number value D8 generated by the random number generator 12 on the basis of the random number value D8 read from the storage. Storing the random number value D8 previously generated by the random number generator 12 in the storage enables the self-test unit 22 to check irreproducibility regarding, for example, repetition, periodicity, and non-uniform distribution of random numbers, on the basis of the random number value D8 read from the storage.

In the semiconductor memory 1 according to the present embodiment, the random number value D8 generated by the random number generator 12 is stored in the memory array 13. Without a need to prepare a large-capacity register or RAM for storing the multiple random number values D8 generated by the random number generator 12 inside or outside the memory controller 11, circuit size is reduced.

While the invention has been described in detail, the foregoing description is in all aspects illustrative and not restrictive. It is understood that numerous other modifications and variations can be devised without departing from the scope of the invention.

What is claimed is:

1. A memory device comprising:
    memory array circuitry that stores content data;
    random number generator circuitry that generates a true random number; and
    memory controller circuitry connected to the memory array circuitry and the random number generator circuitry, wherein the memory controller circuitry:
    performs a reliability test only on the memory array circuitry out of the memory array circuitry and the random number generator circuitry on receipt of a first test command from an external device, and
    performs a reliability test only on the random number generator circuitry out of the memory array circuitry and the random number generator circuitry on receipt of a second test command from the external device, wherein the memory controller circuitry includes a self-test circuit that performs the reliability test of the random number generator circuitry, and the self-test circuit (i) starts checking irreproducibility of random number values, which are generated by the random number generator circuitry, on receipt of input of count information for specifying a number of counts to cause the random number generator circuitry to generate the random number values, and (ii) sends a check result to the external device on completion of checking.

2. The memory device according to claim 1, the memory controller circuitry including an encryption/decryption circuit that performs encryption and decryption on a signal transmitted to and from a host device based on a true random number generated by the random number generator circuitry, wherein in a reliability test of the memory array circuitry, the memory controller circuitry inputs a predetermined fixed random number value in place of a true random number generated by the random number generator circuitry to the encryption/decryption circuit, and the encryption/decryption circuit performs encryption and decryption on a signal transmitted to and from the external device based on the fixed random number value.

3. The memory device according to claim 2, the memory controller circuitry further including a register that stores the fixed random number value, the fixed random number value being contained in the first test command, wherein the memory controller circuitry extracts the fixed random number value from the first test command received from the external device and stores the fixed random number value in the register.

4. The memory device according to claim 2, the memory controller circuitry further including a register that stores the fixed random number value, the fixed random number value being stored in a predetermined storage in the memory device, wherein the memory controller circuitry reads the fixed random number value from the predetermined storage and stores the fixed random number value in the register.

5. The memory device according to claim 1, wherein the self-test circuit inputs a predetermined control signal to the random number generator circuitry to cause the random number generator circuitry to generate a random number value, stores the random number value generated by the random number generator circuitry in a predetermined storage in the memory device, and checks irreproducibility of the random number value generated by the random number generator circuitry based on the random number value read from the predetermined storage.

6. The memory device according to claim 5, the second test command containing the count information, wherein the self-test circuit extracts the count information from the second test command and causes the random number generator circuitry to sequentially generate a plurality of random number values based on the count information.

7. The memory device according to claim 5, wherein a predetermined storage in the memory device stores the count information, and the self-test circuit reads the count information from the predetermined storage and causes the random number generator circuitry to sequentially generate a plurality of random number values based on the count information.

8. The memory device according to claim 5, wherein the self-test circuit checks whether identical random number values are consecutively generated by the random number generator circuitry, as an irreproducibility check of a random number value.

9. The memory device according to claim 5, wherein the self-test circuit checks whether identical random number values are included in a plurality of random number values generated by the random number generator circuitry, as an irreproducibility check of a random number value.

10. The memory device according to claim 5, wherein the self-test circuit checks whether appearance rates of "0" and "1" in a random number value generated by the random number generator circuitry are within a predetermined allowable range, as an irreproducibility check of a random number value.

11. A method for testing reliability of a memory device, the memory device including memory array circuitry that stores content data, random number generator circuitry that generates a true random number, and memory controller circuitry that connects to the memory array circuitry, the method comprising:

performing, by the memory controller circuitry, a reliability test only on the memory array circuitry out of the memory array circuitry and the random number generator circuitry on receipt of a first test command from an external device; and performing, by the memory controller circuitry, a reliability test only on the random number generator circuitry out of the memory array circuitry and the random number generator circuitry on receipt of a second test command from the external device, wherein the memory controller circuitry includes a self-test circuit that performs the reliability test of the random number generator circuitry, and the self-test circuit (i) starts checking irreproducibility of random number values, which are generated by the random number generator circuitry, on receipt of input of count information for specifying a number of counts to cause the random number generator circuitry to generate the random number values, and (ii) sends a check result to the external device on completion of checking.

* * * * *